United States Patent
Kim

[11] Patent Number: 6,034,981
[45] Date of Patent: Mar. 7, 2000

[54] SURFACE LASER DIODE PACKAGE HAVING AN OPTICAL POWER MONITORING FUNCTION

[75] Inventor: Il Kim, Suwon, Rep. of Korea

[73] Assignee: Samsung Electronics Co., Ltd., Kyungki-Do, Rep. of Korea

[21] Appl. No.: 08/845,470

[22] Filed: Apr. 25, 1997

[30] Foreign Application Priority Data

Apr. 25, 1996 [KR] Rep. of Korea ............... 96-12985

[51] Int. Cl.[7] .................................................. H01S 3/085
[52] U.S. Cl. ...................................... 372/50; 372/96
[58] Field of Search ............................... 372/50, 96

[56] References Cited

U.S. PATENT DOCUMENTS 5,732,101 3/1998 Shin ............................................ 372/96

FOREIGN PATENT DOCUMENTS

| 63118259 | 7/1988 | Japan . |
| 1146142 | 6/1989 | Japan . |
| 06097597 | 4/1994 | Japan . |
| WO9518479 | 7/1995 | WIPO . |

OTHER PUBLICATIONS

T. Kim et al., "A single transverse mode operation of top surface emitting laser diode with a integrated photo–diode", conference proceedings of the 8th annual meeting of the ieee lasers and electro–optics society (LEOS), vol. 2, Oct. 30, 1995, pp. 416–417, XP002057227. *the whole document*.
Hayashi Y et al., "Record low–threshold index–guided InGaAs/GaAlAs vertical–cavity surface–emitting laser with a native oxide confinement structure", Electronics Letters, vol. 31, No. 7, Mar. 30, 1995, pp. 560–562, XP000504313. *p. 561, left–hand col.; figure 1*.

*Primary Examiner*—James W. Davie
*Attorney, Agent, or Firm*—Sughrue, Mion, Zinn, Macpeak & Seas, PLLC

[57] ABSTRACT

A surface laser diode package having an optical power monitoring function for a surface laser beam has a surface laser diode for making a spontaneous emission beam generated from an active region oscillate by means of an upper mirror and a lower mirror, and emitting a surface laser beam obtained by the oscillation. A monitor diode, installed between a substrate and the lower mirror of the surface laser diode, performs a light detection operation with respect to the surface laser beam emitted toward the substrate via the lower mirror, in order to monitor the optical power of the surface laser diode.

3 Claims, 2 Drawing Sheets

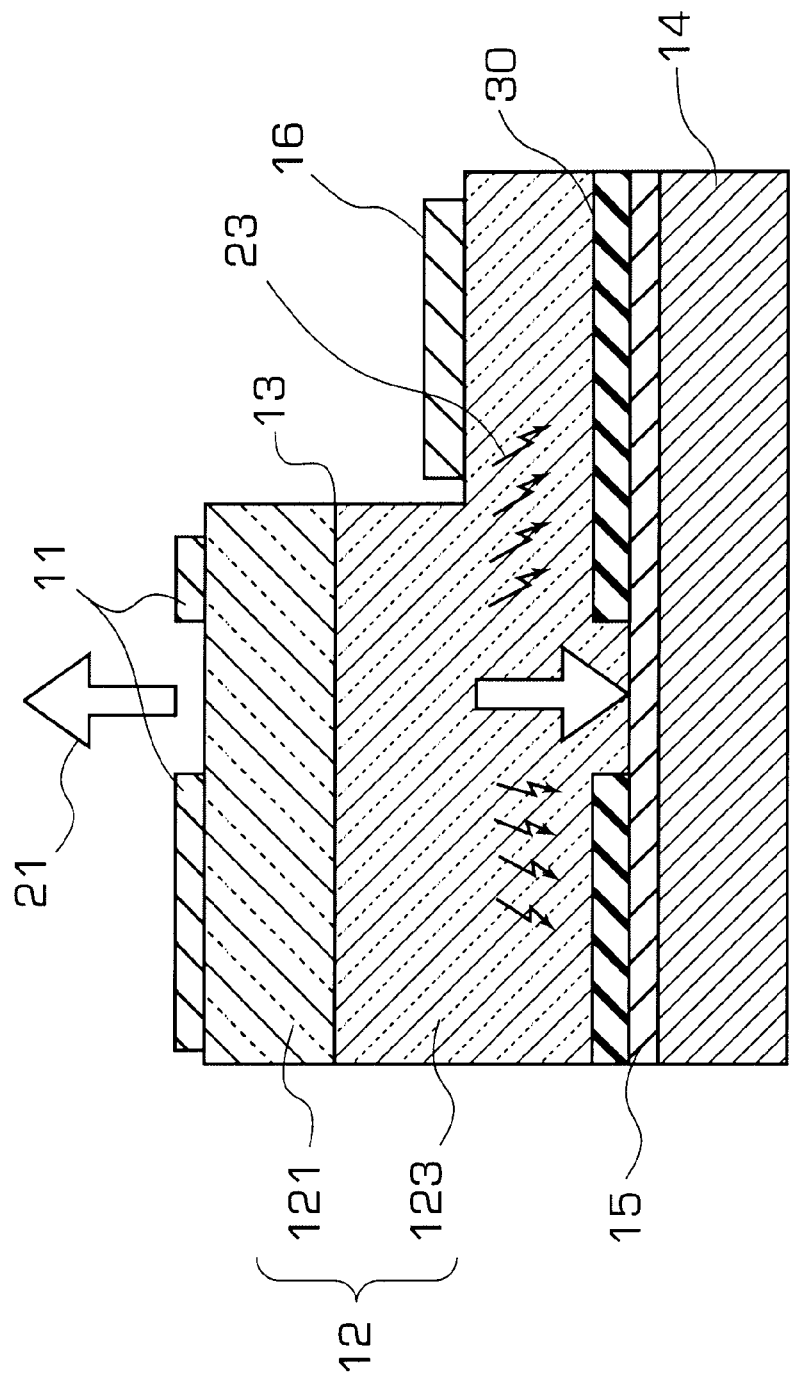

SURFACE LASER DIODE PACKAGE HAVING AN OPTICAL POWER MONITORING FUNCTION

BACKGROUND OF THE INVENTION

1. Field of the Invention

The present invention relates to a surface laser diode package having a monitor diode for monitoring an optical power of a surface laser diode. The present application is based upon Korean Application No. 96-12985, which is incorporated herein by reference.

2. Description of the Related Art

A general optical disc system, such as a compact disc player, projects laser light on an information recording surface of a disc and reads information recorded on the disc. In this optical disc system, if an output of the laser light varies, an error may occur when a signal is read from the disc. Thus, the optical disc system includes an automatic laser power control (ALPC) servo circuit to stably control the output of the laser light. The ALPC servo circuit includes a photodiode for monitoring an optical power of a laser diode, and controls a driving current of the laser diode according to current flowing through the photodiode. Conventional surface laser diode packages will be described below with reference to FIGS. 1 and 2.

In the surface laser diode package of FIG. 1, a monitor diode 15 has a cylindrical shape wrapping around a surface laser diode 12. The monitor diode 15 detects spontaneous emission beams emitted from the lateral surface of the surface laser diode 12. The detected beams are used to monitor an optical power of the beam emitted from the lateral surface of the surface laser diode 12, and are also used to monitor an optical power of the surface laser diode 12. If a current is applied to an electrode 11 of the surface laser diode 12, the current is supplied to an active region 13, and the surface laser diode 12 generates spontaneous emission beams.

If the current supplied to the active region 13 is greater than or equal to a current value necessary for laser oscillation, the spontaneous emission beams generated from the active region 13 is transformed into a surface laser beam 21 by the laser oscillation. The beam emitted from the active region 13 oscillates between an upper mirror 121 and a lower mirror 123 of the surface laser diode 12, and is emitted outwards via the upper mirror 121 and absorbed into a substrate 14 via the lower mirror 123. The upper mirror 121 and the lower mirror 123, having the active region 13 therebetween, are used as a resonator. Since a current density must be large to generate a surface laser beam 21, a portion of the surface laser diode 12, except a laser oscillation area between the upper mirror 121 and the lower mirror 123, is processed by oxidation or proton implantation to make it a high ohmic layer to thereby enlarge a current density.

The spontaneous emission beams generated by the active region 13 do not completely vanish and is minutely emitted in proportion to the optical power of the surface laser diode 12. The monitor diode 15 receives the spontaneous emission beams emitted from the sides of the surface laser diode 12 when current is applied to an electrode 16 of the monitor diode 15, and outputs a monitor current in proportion to the received beam.

However, the surface laser diode package of FIG. 1 has poor temperature characteristics. If temperature varies, an accurate monitor current cannot be output. Also, spontaneous emission beams 21 are used instead of a surface laser beam to monitor optical power thereby causing an error.

The surface laser diode package of FIG. 2 has a monitor diode 15 installed on a surface laser diode 12. The monitor diode 15 detects part of a surface laser beam 21 emitted from the surface laser diode 12 when current is applied to an electrode 16 of the monitor diode 15. The detected beam is used for monitoring an optical power of the surface laser diode 12.

However, since the monitor diode 15 detects the spontaneous emission beams 21 as well as the surface laser beam emitted from the surface laser diode 12, an error occurs in the optical power monitoring. In addition, since the externally emitted surface laser beam 21 is used, optical power of the surface laser diode 12 is lost and the manufacturing process becomes complicated.

SUMMARY OF THE INVENTION

To solve the above problems, it is an object of the present invention to provide a surface laser diode package capable of monitoring optical power by detecting a surface laser beam without spontaneous emission beams among beams emitted toward a substrate via a lower mirror of a surface laser diode.

To accomplish the above object of the present invention, there is provided a surface laser diode package having an optical power monitoring function for a surface laser beam. The surface laser diode package has a surface laser diode for making spontaneous emission beams generated from an active region oscillate by means of an upper mirror and a lower mirror, and for emitting a surface laser beam obtained by the oscillation. A monitor diode, installed between a substrate and the lower mirror of the surface laser diode performs a light detection operation with respect to the surface laser beam emitted toward the substrate via the lower mirror, in order to monitor the optical power of the surface laser diode.

BRIEF DESCRIPTION OF THE DRAWINGS

The preferred embodiments are described with reference to the drawings wherein:

FIG. 3 shows the structure of a surface laser diode package according to a preferred embodiment of the present invention.

DETAILED DESCRIPTION OF THE INVENTION

Figure 1:
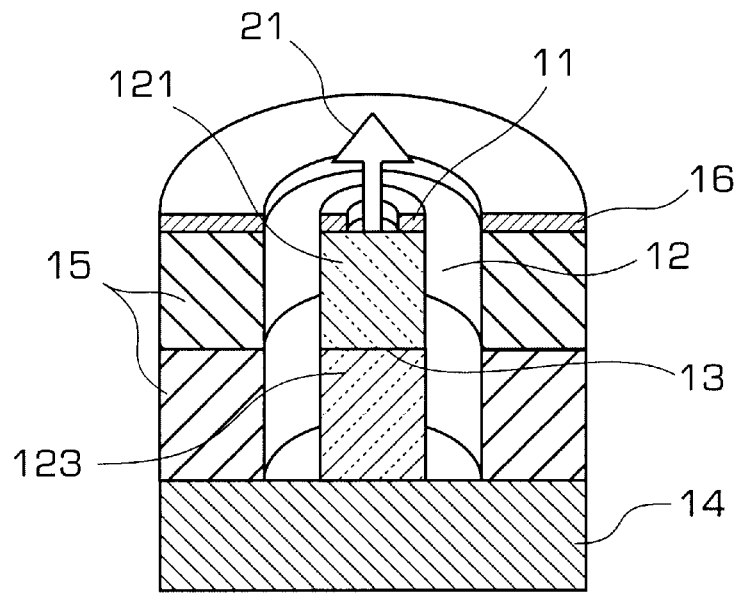
FIGS. 1 and 2 show the structures of conventional surface laser diode packages.
Figure 2:
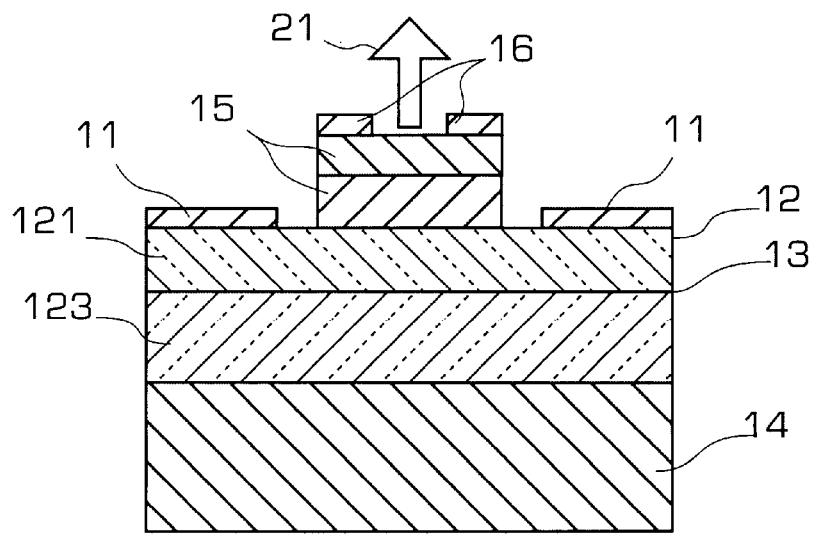

Referring to FIG. 3, the present invention is based on the fact that light emitted from an active region of a surface laser diode package is emitted in both the direction of an upper mirror and the direction of a lower mirror. A monitor diode 15 performs a light detection operation with respect to a laser beam 21 emitted toward a substrate 14 via a lower mirror 123 of the surface laser diode 12. More specifically, the monitor diode 15 is installed on a junction surface of a P-type substrate 14 and an N-type lower mirror 123 of the surface laser diode 12, and performs a light detection operation with respect to the beam emitted via the lower mirror 123. The monitor diode 15 generates a monitor current in proportion to the intensity of the incident laser beam 21. A reference numeral 16 represents the electrode of the monitor diode 15.

Spontaneous emission beams 23 generated by the active region 13 are randomly emitted in various directions, and some of the spontaneous emission beams 23 oscillate between the upper mirror 121 and the lower mirror 123. The spontaneous emission beams 23 which do not oscillate between the mirrors 121 and 123 cause incorrect monitoring of the optical power of the surface laser diode 12. A light scattering portion 30 is used to avoid the detection of these spontaneous emission beams 23.

The light scattering portion 30 is formed by an oxidation process and is installed on the surface of the lower mirror 123, except for a portion from which the surface laser beam 21 is emitted. The spontaneous emission beams 23 incident on the light scattering portion 30 are scattered therefrom. As a result, most of the spontaneous emission beams 23 which do not oscillate are scattered by the light scattering portion 30 constituted by the oxidation processed layer.

The surface laser beam 21 generated by the surface laser diode 12 is incident on the monitor diode 15 via a portion where the light scattering portion 30 is not formed. In this case, only a small amount of spontaneous emission beams 23 are incident on the monitor diode 15 via the portion where the light scattering portion 30 is not formed. However, since the incident spontaneous emission beams 23 have very little intensity, the monitor current generated according to the optical power of the surface laser beam 21 is not effected. Thus, the monitor diode can output a monitor current which is proportional to the optical power of the surface laser diode 12.

As described above, the surface laser diode package having an optical power monitoring function can monitor the optical power of the surface laser diode with high accuracy.

While only certain embodiments of the invention have been specifically described herein, it will apparent that numerous modifications may be made thereto without departing from the spirit and scope of the invention.

What is claimed is:

1. A surface laser diode package having an optical power monitoring function for a surface laser beam, the surface laser diode package comprising:

a substrate;

a surface laser diode for creating oscillations in spontaneous emission beams generated by an active region using an upper mirror and a lower mirror, and emitting a surface laser beam generated by the oscillations; and a monitor diode, installed between said substrate and the lower mirror, for detecting light emitted toward said substrate via the lower mirror, in order to monitor the optical power of said laser diode.

2. The surface laser diode package according to claim 1, further comprising a light scattering portion, installed on a junction surface of said monitor diode and the lower mirror of said surface laser diode except at a portion of the surface of said lower mirror from which the surface laser beam of said upper mirror is emitted, for scattering the spontaneous emission beams via said lower mirror, wherein said light scattering portion is installed on a portion.

3. The surface laser diode package according to claim 2, wherein said light scattering portion is constituted by an oxidation processed layer.

* * * * *